US010247537B2

(12) United States Patent
Premm et al.

(10) Patent No.: US 10,247,537 B2
(45) Date of Patent: Apr. 2, 2019

(54) GRID DIAGRAM CREATION AND OPERATION CONTROL

(71) Applicant: SMA Solar Technology AG, Niestetal (DE)

(72) Inventors: Daniel Premm, Kaufungen (DE); Yehia Tarek Fawzy, Niestetal (DE); Gerd Bettenwort, Kassel (DE); Claus Allert, Kaufungen (DE); Thorsten Buelo, Kassel (DE); Stijn Stevens, Nieste (DE)

(73) Assignee: SMA Solar Technology AG, Niestetal (DE)

( * ) Notice: Subject to any disclaimer, the term of this patent is extended or adjusted under 35 U.S.C. 154(b) by 1115 days.

(21) Appl. No.: 14/571,386

(22) Filed: Dec. 16, 2014

(65) Prior Publication Data
US 2015/0153153 A1    Jun. 4, 2015

Related U.S. Application Data

(63) Continuation of application No. PCT/EP2013/062702, filed on Jun. 19, 2013.

(30) Foreign Application Priority Data

Jun. 22, 2013   (DE) .................. 10 2012 105 459

(51) Int. Cl.
*G01B 7/28* (2006.01)
*H02J 13/00* (2006.01)
(Continued)

(52) U.S. Cl.
CPC .............. *G01B 7/28* (2013.01); *G01R 31/42* (2013.01); *G05B 13/021* (2013.01); *H02J 3/00* (2013.01);
(Continued)

(58) Field of Classification Search
CPC ...... G01B 7/28; G01B 2210/58; G01R 31/42; G05B 13/021; H02J 3/00; H02J 13/0017;
(Continued)

(56) References Cited

U.S. PATENT DOCUMENTS 7,660,649 B1 * 2/2010 Hope .................... G06Q 10/04
                                                         700/28
2010/0070214 A1 * 3/2010 Hyde ................. G01R 19/2513
                                                         702/61
(Continued)

FOREIGN PATENT DOCUMENTS

| DE | 102007055517 A1 | 3/2009 | |
| DE | 102008057563 A1 | 9/2010 | |
| DE | 10201006142 A1 | 8/2011 | |
| EP | 2012132 A1 | 1/2009 | |
| WO | 2009033955 A2 | 3/2009 | |
| WO | WO 2012/008104 | * 1/2012 | ............. G06F 13/00 |
| WO | WO2012062662 | * 5/2012 | ............... H02J 5/00 |

OTHER PUBLICATIONS

International Search Report dated Jun. 12, 2013 for International application No. PCT/EP2013/062702.
Wikipedia.org. "AC Power." Nov. 30, 2014.

*Primary Examiner* — Michael Nghiem
*Assistant Examiner* — Peter Ngo
(74) *Attorney, Agent, or Firm* — Eschweiler & Potashnik, LLC

(57) ABSTRACT

For determining the topology of a grid section of an AC power grid, the grid section comprising a grid connection point, at least one branch branching off from the grid connection point and including a plurality of energy consumption and/or energy generation units, and at least one measurement point in the at least one branch, dependencies of variations of a grid voltage measured at the at least one measurement point based on variations of connection power values of at least some individual ones of the energy consumption and/or energy generation units are determined.

11 Claims, 3 Drawing Sheets

(51) Int. Cl.
  *G01R 31/42* (2006.01)
  *G05B 13/02* (2006.01)
  *H02J 3/00* (2006.01)
(52) U.S. Cl.
  CPC ...... *H02J 13/0017* (2013.01); *G01B 2210/58* (2013.01); *H02J 2003/007* (2013.01); *Y02E 60/76* (2013.01); *Y04S 20/48* (2013.01); *Y04S 40/22* (2013.01)
(58) Field of Classification Search
  CPC .... H02J 2003/007; Y02E 60/76; Y04S 20/48; Y04S 40/22
  USPC .......................................................... 702/57
  See application file for complete search history.

(56) References Cited

U.S. PATENT DOCUMENTS

| | | | | |
|---|---|---|---|---|
| 2011/0298292 | A1* | 12/2011 | Bremicker | H01L 31/02021 307/82 |
| 2012/0123995 | A1* | 5/2012 | Boot | G01R 21/1333 706/54 |
| 2012/0173177 | A1* | 7/2012 | Nishiyama | H02J 13/0017 702/62 |
| 2013/0241297 | A1* | 9/2013 | Falk | H02J 3/383 307/80 |

* cited by examiner $$\frac{\partial u_i}{\partial p_j} = \begin{matrix} \frac{\partial u_1}{\partial p_1} & \cdots & \frac{\partial u_1}{\partial p_m} \\ \vdots & & \vdots \\ \frac{\partial u_n}{\partial p_1} & \cdots & \frac{\partial u_n}{\partial p_m} \end{matrix}$$

Fig. 2

$$\frac{\partial u_i}{\partial q_j} = \begin{matrix} \frac{\partial u_1}{\partial q_1} & \cdots & \frac{\partial u_1}{\partial q_m} \\ \vdots & & \vdots \\ \frac{\partial u_n}{\partial q_1} & \cdots & \frac{\partial u_n}{\partial q_m} \end{matrix}$$

Fig. 3

GRID DIAGRAM CREATION AND OPERATION CONTROL

REFERENCE TO RELATED APPLICATIONS

This application is a continuation of International application number PCT/EP2013/062702, filed on Jun. 19, 2013, which claims priority to German application number 10 2012 105 459.2, filed on Jun. 22, 2012.

FIELD

The present disclosure relates to a method of determining the topology of a grid section of an AC power grid, the grid section comprising a grid connection point, at least one branch branching off from the grid connection point and including several energy consumption and/or generation units, and at least one measurement point within the at least one branch. Further, this disclosure relates to a method of operating a plurality of energy consumption and/or generation units, which are arranged in a grid section of an AC power grid and which are controllable with regard to their connection power values.

BACKGROUND

The increasing spread of small and medium sized energy generation units, which are somewhere connected to an AC power grid, increasingly complicates the operation control of AC power grids. In case of an increasing global demand of electric power in an AC power grid, the power of a central power plant may simply be increased, without considering particular characteristics of a topology of the AC power grid, i.e. connections of the various grid levels, subdivisions of a grid level into individual branches or electric relative positions of energy consumption and/or energy generation units with regard to each other. However, this does not apply to local energy generation units or systems of a plurality of energy generation units. Here, problems with regard to distributing the power in the AC power grid may occur due to local imbalances between generation and consumption of electric power. For example, there may already be a local surplus of electric power due to local energy generation units, even if the overall demand in the AC power grid exceeds the overall supply of electric power. A further increase of the energy fed by these local energy generation units then results in at least locally leaving the allowable operation range of the AC power grid in that, for example, voltage threshold values are exceeded and/or operation equipment, particularly electric lines, is overloaded. Similarly, under these circumstances, it is of little use to switch off an energy consumption unit in an area of the AC power grid in which the surplus of electric power is present, in order to reduce an overall lack of electric power. Particularly, a operation control of an AC power grid by means of global control signals directed to all connected controllable energy generation units and energy consumption units in a same way is not suited for solving this contradiction between local and global problems.

DE 10 2010 006 142 A1 discloses an energy portal for controlling an energy supply by an energy generation grid. In controlling operation parameters of the energy generation grid the energy portal considers feed-in factors, energy generation grid measurement values and prognosis information. The energy portal includes a feed-in factor receiver for receiving feed-in factors which may be pre-set by an operator of an energy distribution grid, an energy generation measurement value receiver for receiving measurement values of the energy generation grid, a prognosis information receiver for receiving prognosis information, an evaluation unit for evaluating the measurement value, feed-in factors and prognosis information, and an operation parameter controller controlling the operation parameters of the energy generation grid based on the evaluated measurement values, feed-in factors and prognosis information using the feed-in factors as a control variable. In this way, it shall be achieved that the feed-in factors pre-set by the operator of the energy distribution grid are met. Actually, however, this result may only be achieved when exactly knowing the topology of the entire AC power grid.

DE 10 2007 055 517 A1 discloses a method of operating an energy supply grid. The energy supply grid includes at least one or a plurality of energy generation units and/or one or a plurality of energy consumption units, wherein one or more supply categories having a pre-set priority is/are assigned to each of them. Based on the supply classes, the energy generation units are computer-controlled with regard to the energy supplied, and/or the energy consumption units are computer-controlled with regard to the energy consumed. In the course of the known method, a computer-based determination of the topology of the energy supply grid shall take place to enable a demand-based control of the respective units of the energy supply grid. Topology data of an energy supply area shall represent the structure of the grid of the supply lines and statistical machine data of the units in the respective energy supply area. The structure of the line grid shall be automatically recognized by exchange of data between the respective power distribution computer and an area computer. The area computer shall periodically download the equipment values to update the topology data for the energy supply area. Particularly, a power distribution computer, when connected to a supply line, shall automatically determine which units are already connected to the respective supply line. For this purpose, the power distribution computer measures physical line data, like for example the impedance. Afterwards, the information obtained by the power distribution computer are transferred to the area computer of the respective energy supply area. The area computer uses this data for determining a topology of the energy supply area. These measurements, however, are not sufficient to determine a topology of a grid section at a precision sufficient for an optimized operation control within the grid section.

DE 10 2008 057 563 A1 discloses a method and an apparatus for grid conforming operation of a low voltage grid comprising a plurality of local energy generation units and/or energy consumption units. The units are connected to a superordinate facility common to all units, which is operated by an energy trader, for exchanging information via a communication medium. Each unit comprises an energy manager which, by means of an optimization program and a fixed tariff profile, calculates an economically optimized operation plan for its energy consumption units and generators. A grid conforming operation is achieved in that grid parameters resulting at grid connection points of the units are surveyed for keeping tolerance ranges assigned to them, and in that the superordinate facility, when the grid parameters at at least one grid connection point leave the assigned tolerance range, transfers an amended tariff profile to at least one critical unit to bring the grid parameters at least closer to the tolerance ranges again. If, by means of this known method, the operation control of a grid section shall be optimized, all units consuming or generating relevant amounts of energy have to be connected to the facility operated by the energy dealer. Further, the indirect control of the units via the tariff profiles transmitted to them is slow.

EP 2 012 132 A1 discloses a consumption and status meter which comprises an analyzer for power consumers. Individual consumers are recognized by a finger print of their power consumption. If the power consumption is determined at different sockets, it is also recognized to which socket the respective power consumer is connected.

There still is a need of a method of determining the topology of a grid section of an AC power grid, which provides sufficient information as to an, at first, unknown topology of a grid section to optimize the management of the AC power grid in the grid section by means of energy consumption and/or generation units which are controllable with regard to their connection power values.

SUMMARY

The present disclosure provides a method of determining a topology of a grid section of an AC power grid, the grid section comprising a grid connection point, at least one branch branching off from the grid connection point and including a plurality of energy consumption and/or generation units, and at least one measurement point in the at least one branch. The method comprises measuring the grid voltage at the at least one measurement point; and determining dependencies of variations of the grid voltage at the at least one measurement point based on variations of connection power values of at least some individual energy consumption and/or generation units of the plurality of energy consumption and/or generation units. The connection power values include measured connection power values of at least one of the at least some individual energy consumption and/or generation units.

The present disclosure further provides a method of operating a plurality of energy consumption and/or generation units which are arranged in a grid section of an AC power grid and which are controllable with regard to their connection power values for achieving at least one optimization aim. In controlling the energy consumption and/or generation units, a topology of the grid section is considered. Determining the topology comprises measuring the grid voltage at at least one measurement point in the grid section; and determining dependencies of variations of the grid voltage at the at least one measurement point on variations of connection power values of the plurality of energy consumption and/or generation units.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The present disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

FIG. 2 shows a matrix of dependencies of variations of a grid voltage measured at various measurement points of the grid section according to FIG. 1 based on variations of active power components of connection power values of various energy consumption and/or energy generation units in the grid section.

FIG. 3 shows a matrix corresponding to FIG. 2 of dependencies of variations of the grid voltage based on reactive power components of the connection power values of the individual energy consumption and/or energy generation units.

DETAILED DESCRIPTION

Figure 1:
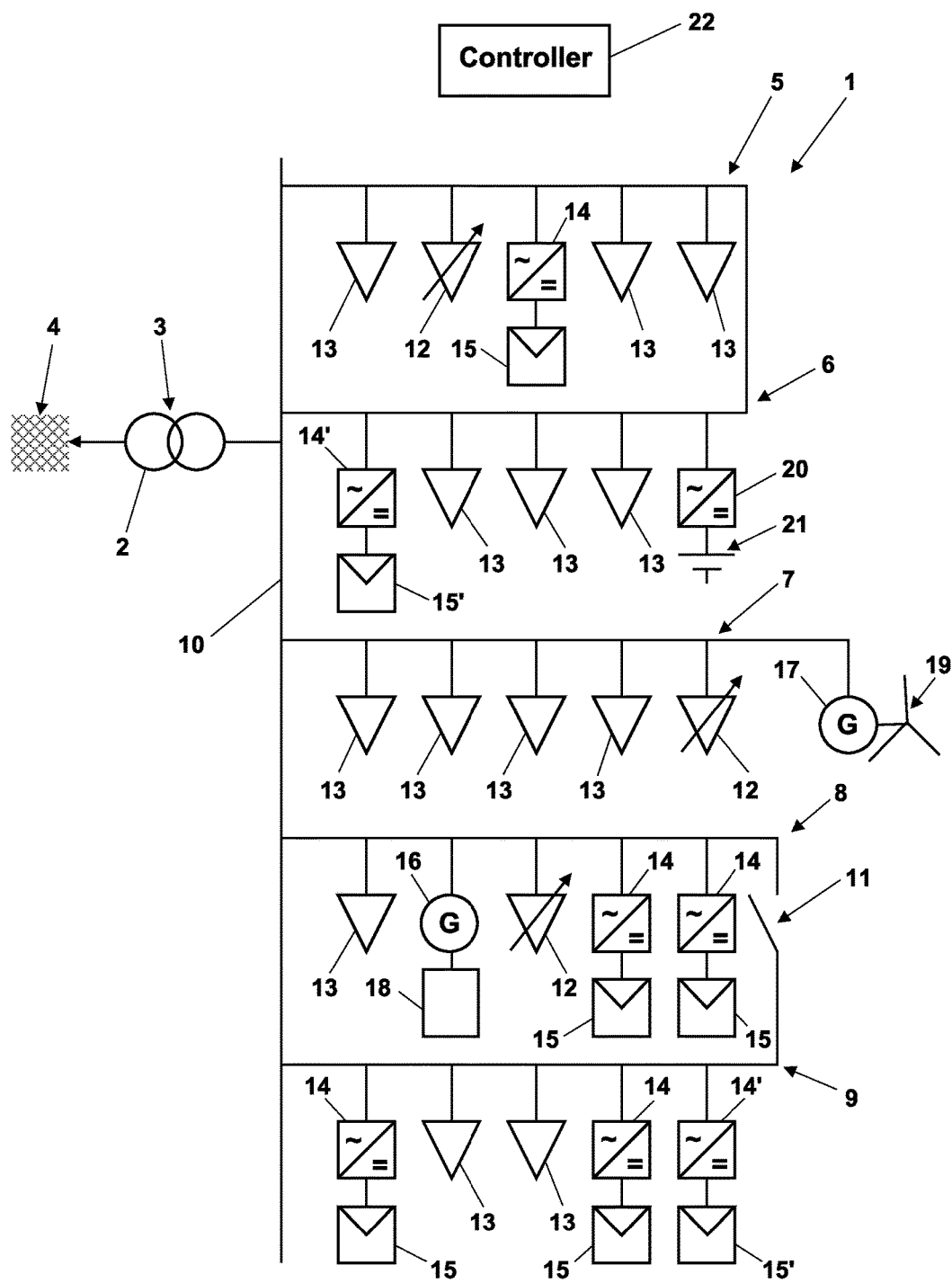
FIG. 1 schematically shows a grid section of an AC power grid connected to a remainder of an AC power grid at a grid connection point via a transformer.

The present disclosure relates to a method of determining the topology of a grid section of an AC power grid, the grid section comprising a grid connection point, at least one branch branching off from the grid connection point and including several energy consumption and/or generation units, and at least one measurement point within the at least one branch. Further, this disclosure relates to a method of operating a plurality of energy consumption and/or generation units, which are arranged in a grid section of an AC power grid and which are controllable with regard to their connection power values.

Here, the term "grid section of an AC power grid" is understood as an area of an AC power grid that is connected to other areas of the AC power grid via its grid connection point. Particularly, a transformer may be provided at the grid connection point, which transforms a medium voltage down to a low voltage which is present in the grid section as a grid voltage.

Besides energy consumption units and energy generation units, the term "energy consumption and/or generation units" as used here shall also cover energy storage units which at times take up energy like an energy consumption unit for charging an energy storage, and which at other times supply energy like an energy generation unit by discharging the energy storage. Further, the term "energy consumption and/or generation units" also covers grid subsections with several energy consumption and/or generation units that are connected to the respective branch of the grid section via a common connection. This particularly covers all energy consumption and/or energy generation units in and at a building which are connected to a branch of a grid section via a common house connection, or several energy generation units of an energy generation system which are connected to a branch of a grid section via one system connection.

Starting from a generally known method in which connection power values of at least one of a plurality of energy consumption and/or generation units and variations of a grid voltage at at least one measurement point, like for example directly at the at least one energy consumption and/or generation unit, are measured, the method of determining the topology of a grid section of an AC power grid according to this disclosure determines dependencies of variations of the grid voltage at the at least one measurement point based on variations of the connection power values of at least some individual energy consumption and/or generation units of the plurality of energy consumption and/or generation units in the grid section.

The variations of the connection power values are variations of the active power and/or the reactive power of the respective energy consumption and/or energy generation units. These variations have different effects on the grid voltage measured at the at least one measurement point, depending on which electric relative positions the respective energy consumption and/or generation units and the at least one measurement point have within the grid section. The electric relative positions are particularly defined by a connection to the same or another phase of the AC power grid, by an assignment to the same or another branch of the grid section, and/or by a relative sequence within a branch, for example a relative distance to a grid connection point, i.e. a local grid transformer. Vice versa, conclusions on the electric relative positions of the individual energy consumption and/or generation units with regard to the at least one measurement point and the grid connection point of the grid section may be drawn from determined dependencies. Particularly, it may be determined from determined dependencies, whether a measurement point or an energy consumption and/or generation unit are connected to a same phase and/or in a same branch of the grid section. If a measurement point and an energy consumption and/or generation unit are connected in the same branch, it is also possible to determine the sequence of the connection from the point of view of the grid connection point, i.e. the relative distances to the grid connection point.

The information available for determining the electric relative positions increases with the number and distribution of the measurement points at which the grid voltage is measured. In determining and/or subsequent depicting the electric relative positions of the energy consumption or energy generation units and the measurement points, known electric and spatial relative positions which, for example, have been obtained by means of a geographical information system, may be used as reference points.

The result of the method according to this disclosure may thus be a grid map on which the positions of the individual energy consumption and/or energy generation units are indicated with regard to the measurement points. For a following optimized operation control of the AC power grid in the grid section, such a grid map, however, is no imperative precondition. The topology of interest, i.e. the electric relative positions of the individual energy consumption and/or energy generation units and the measurement points, are already sufficiently determined with regard to their relevant effects in that the dependencies of the variations of the grid voltage at the measurement points based on the variations of the connection power values of the individual energy consumption and/or generation units are known in a normalized form. These dependencies indicate how, i.e. for example at which impedance, the grid voltage at the various measurement points may be influenced by a variation of the connection power values of the energy consumption and/or generation units. This is the decisive knowledge which is needed for an optimization of the operation control of the AC power grid within the grid section. Particularly, the result of the method according to this disclosure may be a matrix which represents the dependencies of the grid voltage at the measurement points based on the connection power values of the individual energy consumption and/or generation units in a normalized form. For determining such a matrix, the electric relative positions of the some individual energy consumption and/or generation units may, for example, be determined by means of a correlation analysis of the variations of the grid voltage at the measurement points and the variations of the connection power values.

In the method according to this disclosure, the variations of the connection power values may be directly measured at all energy consumption and/or generation units. These data will often be available for at least some of the energy consumption and/or generation units. Generally, the variations of the connection power values of individual energy consumption or energy generation units may also be derived from the resulting variations of the grid voltage at the at least one measurement point. If dependencies of the variations of the grid voltage on variations of measured connection power values in the electric proximity of these energy consumption and/or energy generation units are available, not only relative but also absolute values of the variations of the not (directly) measured connection power values can be determined from the resulting variations of the grid voltage. If the variations of the connection power values shall be derived from the variations of the grid voltage, there is, however, an increased difficulty in associating the variations of the grid voltage with individual energy consumption and/or generation units or with the variations of their connection power values. This association may, however, be made based on characteristic time courses of the connection power values of the energy consumption and/or generation units. Particularly, such an analysis for correlations between variations of the measured grid voltage and variations of the connection power values characteristic for certain energy consumption and/or generation units allows for an identification of these energy consumption and/or generation units within the grid section.

Thus, for example, at first unknown energy consumption and/or generation units may be recognized and arranged with regard to their electric position based on variations of the grid voltage which are caused by variations of their connection power values, and which are systematically offset in time with regard to generally same variations of directly measured connection power values of known energy generation units. This is particularly possible if the energy generation units of interest are of a type whose connection power values are determined by weather influences like insolation or wind speed, and if these weather influences show local variations whose spatial distribution moves over the grid section while essentially remaining unchanged. If, for example, a cloud passes over the spatial area of the grid section, it causes characteristic variations of the connection power values of energy generation units including photovoltaic generators and located at different positions at different points in time. Something similar applies to a gust of wind or a weather front with strong differences in atmospheric pressure which reach different wind power plants and result in characteristic variations of their connection power values at different points in time. These variations, i.e. a transient decrease or increase of the connection power values, if they are actually determined at one of the energy generation units, may be used for recognizing similar energy generation units due to a same pattern of their influences on the grid voltage at the at least one measurement point by means of correlation analysis. If, at the same time, the wind direction and wind velocity are known, besides the electric relative positions of the at first unknown energy generation units, their spatial positions may also be determined.

In particular, a correlation of the time course of the connection power values with the time course of the grid voltage at the at least one measurement point, which, in case of a weather-caused variation of the connection power values, may particularly be a correlation of a time course of the active power of one of the energy generation units with the time course of the grid voltage at the at least one measurement point, may be determined for correlation analysis. Then, an autocorrelation of one or a plurality of time courses of the grid voltage measured at the one or the plurality of measurement points may be determined to search for similar variations of the grid voltage which are not caused by the known variations of the connection power values of the one energy generation unit. The result is information on whether a similar energy generation unit is present in the grid section, because, if a variation of the grid voltage offset in time is caused by the variation of the connection power values of a similar energy generation unit offset in time, it can be recognized as a correlated result. Particularly, if the at least one measurement point is part of an energy generation unit, the energy generation unit may in this way determine information on the topology of the surrounding grid section relevant for its operation. Based on this information, the energy generation unit may for example adjust its contribution to grid support, particularly a dependency of the feeding of active power and/or the provision of reactive power depending on grid properties like the grid frequency and/or the grid voltage.

In case that a plurality of measurement points are present which may each be part of an energy generation unit, cross-correlations between the time courses of the connection power values and the time courses of the grid voltage may also be determined; this also results in information on the electric relative positions of the energy generation units with regard to each other in that an amplitude of the cross-correlation depends both on the respective connection of the energy generation units to the phases and the branches of the grid section and on the sequence of the connection of the energy generation units within a branch, i.e. on the distance of the energy generation units to the grid connection point.

Up to now, only variations of the connection power values of the energy consumption and/or generation units have been considered which are caused by random or not non-influenceable events. A more simple association of occurring variations of the grid voltage at the at least one measurement point with variations of the connection power values of certain energy consumption and/or generation units, however, is possible, if the variations of the connection power values of the respective individual energy consumption and/or generation unit of interest are forced with a characteristic course and thus occur with this characteristic course at a known point in time. This includes purposefully switching on the respective energy consumption and/or energy generation unit and a purposeful varying of its connection power values which may also be coded with a certain frequency pattern to be able to precisely associate them with a certain variation of the grid voltage at the at least one measurement point.

With regard to the variations of the connection power values, variations of the active power and the reactive power of the respective energy consumption and/or energy generation unit are preferably evaluated separately. This particularly applies if the determination of the topology of the respective grid section shall be the basis for an operation control of the AC power grid within the grid section which shall influence the grid voltage both by purposefully feeding-in or purposefully consuming active power and by purposefully providing reactive power. If the result of the method according to this disclosure is a matrix, which represents the dependencies of the grid voltage on the connection power values of the individual energy consumption units and energy generation units in normalized form, this matrix has complex values, or there are two separate matrices for the dependencies of the grid voltage on the active power and the reactive power of the connection power values. Further, particularly in case of knowledge about the connection of the measurement points and the individual energy consumption and/or generation units to the individual phases of the grid section, separate matrices may be determined for each phase of the AC power grid.

As the method according to this disclosure determines the dependencies of the variations of the grid voltage based on the variations of the connection power values of individual energy consumption and/or energy generation units, i.e. the sensitivity of the grid, variations of the connection power values of individual energy consumption and/or generation units as a reaction based on variations of the grid voltage may vice versa be modified to achieve an optimized operation control of the AC power grid. Particularly, for example, control curves, which determine the connection power values of the energy consumption and/or generation units as a function of measured grid state variables, may be optimized in such a way that energy consumption and/or generation units which are connected to the grid at points of higher sensitivity contribute more to voltage support by means of a steeper control curve than energy consumption and/or energy generation units connected to points of lower sensitivity. One example for this is the purposeful provision of reactive power by energy generation units close to the grid connection point. Vice versa, it may be suitable to cause smaller variations of the connection power values of energy consumption and/or generation units at points of higher sensitivity with variations of the grid voltage by means of a flatter control curves to, for example, avoid unnecessary fluctuations of the electric power fed in by an energy generation unit at an end of a branch, i.e. far away from the grid connection point, which has a direct effect on the grid voltage within the entire branch.

In the method of operating a plurality of energy consumption units and/or energy generation units which are arranged in a grid section of an AC power grid and which are controllable with regard to their connection power values for achieving at least one predetermined optimization aim, wherein a topology of the grid section is considered in controlling the energy consumption and/or energy generation units, the topology is determined according to the method of this disclosure described above. As the energy consumption and/or generation units of the plurality of energy consumption and/or generation units are controllable in this case, it is advantageous to purposefully vary their connection power values separately from each other to cause the relevant variations of their connection power values and the resulting variations of the grid voltage. Additionally, further active operation facilities may be present in the grid section, like for example controllable transformers, remotely switchable separating points or special reactive power sources, which are controllable for achieving the at least one predetermined optimization aim in the method of operating according to this disclosure.

The dependencies of the grid voltage at the individual measurement points on the variations of the connection power values of the individual energy consumption and/or generation units determined according to the method of operating according to this disclosure allow for a simple estimation which effect a variation of the respective connection power values will have on the grid voltage at the various measurement points. For example, the controllable energy consumption and/or generation units and any present active operation facilities may be purposefully selected based on which of them may most effectively change a given distribution of the grid voltage over the measurement points into a desired distribution of the grid voltage over the measurement points. Particularly, any undesired effects of variations of the connection power values of individual energy consumption or energy generation units may either be avoided from the outset or compensated for by suitable countermeasures.

In the method of operation according to this disclosure, the at least one optimization aim which is achieved by controlling the energy consumption and/or energy generation units and any active operation facilities may, for example, be selected from:

Keeping away all operation parameters of the grid section from stability limits. This aspect particularly applies to keeping the grid voltage within a predetermined range of values and ensuring an availability of active power in all parts of the grid section.

A defined power flow at a certain point of the AC power grid, particularly at a grid connection point via which the grid section is connected to the further AC power grid. This aspect also includes avoiding that electric energy for the grid section is obtained at the grid connection point via one of a plurality of phases of the AC power grid, whereas electric power from the grid section is fed into the further AC power grid via another of these phases.

A maximum utilization of the grid capacity available in the grid section. This aspect relates to not overloading lines of the AC power grid within the grid section but to use them to a maximum extent to particularly ensure that the power of fluctuating regenerative energy sources, in view of limited grid capacities, is used to a maximum extent.

A maximum conservation of controllable energy consumption and/or generation units. The profitability of energy consumption and/or generation units strongly depends on how long they may be operated without additional investment. Achieving a maximum lifetime requires a considerate operation of the energy consumption and/or generation units. This particularly applies to energy storage units to a particular extent, in view of the useable charging capacity of its accumulators which inter alia depends on the number of charge and discharge cycles.

A general maximization of economic advantages. These advantages may be dependent on present tariff conditions which have to be considered, then.

A maximum utilization of energy from regenerative energy generation units. The term "regenerative energy generation units" refers to all energy generation units whose generators make use of regenerative energy, like for example solar energy or wind energy. Using only energy from regenerative energy generation units, if possible, is equivalent to using as little other energy as possible, particularly energy conventionally generated from fossil resources.

Several of the optimization aims mentioned may be strived for one after the other. Then, for achieving any further optimization aim, only those measurements are taken which do not conflict with the already achieved optimization aim.

Alternatively, a plurality of optimization aims may be strived for at the same time. Here, the individual optimization aims may be weighted equally or differently. Thus, an own benchmark standard may be set for the partial achievement of each optimization aim, and the sum of the obtained benchmarks may be maximized to achieve the totality of the plurality of optimization aims according to their weighting to an as far extent as possible.

In the method of operation of this disclosure, the at least one optimization aim and/or the sequence or the weighting of a plurality of optimization aims may particularly be defined by an operator of the AC power grid. Without such definitions, general optimization aims, like for example the grid stability or the maximum usage of energy from regenerative energy generation units, may be considered.

The dependencies of the grid voltage at the individual measurement points on the connection power values of the individual energy consumption and/or generation units, which have been determined according to this disclosure, often directly indicate how an optimum local intervention is possible with certain units. It may, however, be suitable to rank the controllable energy consumption and/or generation units and any present active operation facilities with regard to their efficiency in being operated for achieving the at least one optimization aim, i.e. to classify them, and to generally operate them according to their ranking for achieving the respective optimization aim. At least, it will be reasonable to consider such a ranking in the management of the AC power grid. This, for example, means that reactive power for stabilizing the grid voltage is provided with energy generation units easily capable of providing reactive power but not with energy generation units less suited for this purpose only because they are arranged closer to the measurement point at which the grid voltage is to be increased, for example. Additionally, the knowledge of the connection power values of at least some of the energy consumption and/or generation units in a grid section may be used to combine all other energy consumption or generation units not known as such in groups of equivalent energy consumption and/or generation units to evaluate all energy consumption and/or generation units of each group with regard to a time course of their overall consumption or generation profile. This enables a further enhancement of the method of operating according to this disclosure.

Now referring in greater detail to the drawings, FIG. 1 schematically shows a grid section 1 which, via a transformer 2 at a grid connection point 3, is connected to a remainder of a superimposed AC power grid 4 and which has an example electrical topology discussed in the following. The grid section 1 is divided up in several branches 5 to 9 which branch off from a bus 10 and which may further branch into partial branches not depicted here. In the present case, the branches 5 and 6 are connected at their far ends and form a ring. The branch 7 has a free end, and a switchable disconnecting point 11 is connected between the branches 8 and 9. As long as there is no reactive power in the grid section 1, a fixed nominal grid voltage of the grid section 1 set by the transformer 2 is present at the bus 10. The branches 5 to 9 include (i) loads 12 which are controllable with regard to their connection power values and non-controllable loads 13 as pure energy consumption units, and (ii) inverters 14 with connected photovoltaic generators 15 and generators 16 and 17 with connected combustion engines 18 or wind rotors 19 as pure energy generation units, and (iii) inverters 20 with connected energy storages 21 as energy consumption and generation units which may both take up electric energy and supply electric energy. The number and arrangement of the various energy consumption and/or generation units and their distribution over the branches 5 to 9 are arbitrary and unknown at the beginning. Further, both the loads 12 and 13 and the energy consumption units may represent grid subsections with a plurality of energy consumption and/or generation units which are connected to the respective branch via a common connection, i.e., for example, in case of a plurality of energy consumption and/or generation units within one building via a house connection point, or in case of an energy generation systems with a multitude of energy generation units via common system connection point. In the grid section 1, the flow of energy via the grid connection point 3 and the grid voltage of the grid section at the grid connection point 3 are measured. The grid voltage is also measured at least at the inverters 14 and 20, and, typically, also at the generators 16 and 17 as these have to be operated in a way coordinated with the AC power grid and thus have to survey the state of the AC power grid, to, for example, recognize the formation of an island grid. Concurrently, the connection power values, i.e. the active power fed in to the AC power grid and if present also the reactive power generated by the units, is measured at the inverters 14 and 20 and at the generators 16 and 17. The connection power values are also available from the controllable loads 12. All measurement values of the grid voltage and the connection power values are transferred to a controller 22 which vice versa controls the controllable loads 12 and at least the inverters 14 and 20, typically also the generators 16 and 17 with regard to their connection power values. This control serves for controlling the operation of the AC power grid in the grid section 1. By means of this operation control, different optimization aims may be strived for. These optimization aims include at first the stabilization of the AC power grid in all areas of the grid section 1. This stabilization means that, at least, the grid voltage is everywhere kept within pre-set limits.

In the inverters 14' with connected photovoltaic generators 15 whose reference numerals are indicated with an apostrophe, the measurement values of the grid voltage and the connection power values are generally available, and their connection power values may also be generally varied. This, however, does not apply to the controller 22, because these units, for example, originate from another manufacturer or are operated by another operator.

To achieve the above mentioned optimization aims in operation control of the AC power grid in all areas of the grid section 1 by means of purposefully or aim-oriented operating the loads 12 and the inverters 14 and 20, the topology of the grid section 1 has to be known. This is often not the case at all or at least not at a sufficient accuracy. To solve this problem, the controller 22 determines dependencies of variations of the grid voltage at all measurement points of the grid section 1 available to the controller based on simultaneously occurring variations of the connection power values available to the controller 22, separately for the reactive power and the reactive power components of the connection power values. These dependencies may be represented in the form of matrices $\delta u_i/\delta p_j$ for the dependency of the grid voltage u at the individual measurement points i on the active power component p of the connection power values of the individual energy consumption and/or generation units j, and $\delta u_i/\delta q_j$ for the dependencies of the grid voltage u on the reactive power component q as shown in FIGS. 2 and 3. In so far as the entries in these matrices are normalized, they do not only indicate the dependencies of the grid voltage at the various measurement points on the various connection power values but also the electric relative positions of the individual units and of the measurement points with regard to each other.

Thus, an entry differing from zero in the matrix $\delta u_i/\delta p_j$ means an ohmic coupling of the respective energy consumption and/or generation unit to the respective measurement point. Such an ohmic coupling is typically only given within the same branch, and it is particularly pronounced within one phase of one branch. On the other hand, there are also (small valued) entries differing from zero in the matrix $\delta u_i/\delta q_j$ for energy consumption and/or generation units and measurement points in different branches.

Increasing entries in the lines of both matrices, particularly, however, in $\delta u_i/\delta p_j$, point to increasing distances between the respective energy consumption and/or generation unit j and the grid connection point 3 or the bus 10 within that part of the respective branch extending between the bus 10 and the measurement point i. The reason for this is that a variation of the connection power values essentially causes a change in voltage drop only over that part of the respective branch 5 to 9 which extends between the respective energy consumption and/or generation unit and the bus 10 at which the fixed nominal grid voltage is present. In considering variations of the connection power values, the aforesaid applies independently of whether the respective branch as a whole takes out power from the bus or feeds in power into the bus. For the same reason, about equal entries within one line indicate that the individual energy consumption and/or generation units j are electrically farther away from the bus 10 than the measurement point i, or that they are connected to another branch. Here, comparatively large valued entries in $\delta u_i/\delta p_j$ indicate an already far distance of the measurement point i to the bus 10.

By comparing the entries in the individual lines and columns of both matrices, the individual measurement points i and the individual energy consumption and/or generation units j may not only be assigned to the individual branches 5 to 9 but also located along the branches 5 and 9 in a successive manner. The accuracy achievable here depends on the density of the measurement points i. A desirable high density of the measurement points i is given if the grid voltage is measured at each energy consumption and/or generation unit j.

At the same time, it can be directly read from the matrices $\delta u_i/\delta p_j$ and $\delta u_i/\delta q_j$ which effect a certain variation of the active power or reactive power component of the connections power values of a certain energy consumption and/or generation unit j will have on the grid voltage at the measurement points i. This knowledge is used by the controller 22 according to FIG. 1 to purposefully control the controllable units in such a way that, by the operation control of the AC power grid, the respective optimization aim is achieved in the area of the grid section 1.

It is, however, possible not only to evaluate directly measured connection power values but also connection power values which, for example due to a characteristic time course, may be assigned to one individual energy consumption and/or generation unit. If comparative values of measured connection power values are available, both the electric relative positions of the respective energy consumption and/or generation unit and the absolute variation of their connection power values may be derived from the available measurement values of the grid voltage at the different measurement points.

The assignment of the variations of the grid voltage at the individual measurement points to variations of the connection power values of individual energy consumption and/or generation units may particularly be based on characteristic time courses of the variations of the connection power values or the resulting variations of the grid voltage. This includes the possibility of recognizing a measured weather-dependent time-wise variation of the connection power values of one of the inverters 14 with connected photovoltaic generators 15, which, in a comparable form and at an offset time, also occurs at non-monitored inverters 14' with photovoltaic generators 15', due to a correlation of the resulting variation of the grid voltage at one or more measurement points with the measured weather-dependent time-wise variation of the connection power values or the resulting variation of the grid voltage. Here, the offset in time may also be evaluated with regard to a spatial relative position of the energy generation units. The assignment of variations of the grid voltage at the measurement points is, however, even easier, if the causal variations of the connection power values of the individual energy consumption and/or generation units are forced by the controller 22 and comprise defined time courses so that they differ from random variations of the connection power values and also from variations of the connection power values of other energy consumption and/or generation units.

The effect of the disconnecting point 11 on the grid voltage at the individual measurement points may also be entered as one column in one of the matrices, even if the switching position of the disconnecting point 11 does not vary any connection power value.

Figure 4:
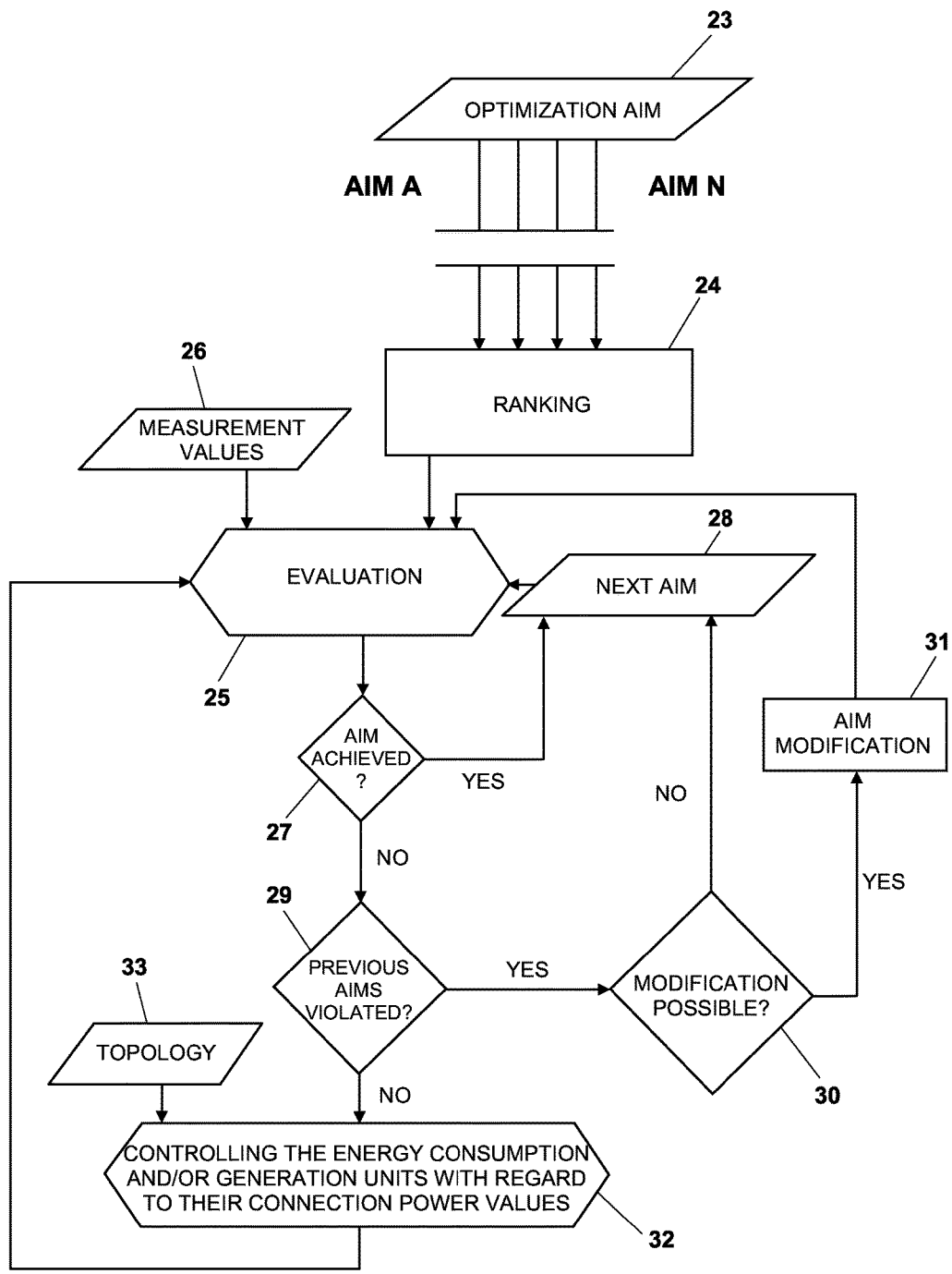
FIG. 4 shows a flow chart of an embodiment of the method of operating a plurality of energy consumption and/or energy generation units in a grid section according to the present disclosure, in which different optimization aims are sequentially strived for by aim-oriented operating the energy consumption and/or generation units considering a topology of the grid section.

FIG. 4 describes an example of a method of operation of a plurality of energy consumption and/or generation units arranged in the grid section by which different optimization aims are strived for. These optimization aims are predetermined at 23, and they are depicted here as aim A to aim N. At 24 the optimization aims are prioritized, i.e. ranked. In the following act 25 the measurement values which are determined at 26 are evaluated with regard to whether the first optimization aim, i.e. the optimization aim of the highest priority, is already achieved with the present measurement values. If it is determined at 27 that the optimization aim is already achieved, the next optimization aim is put forward at 28, and in a repetition of act 25 the measurement values are evaluated for whether the next optimization aim is also already achieved. If, however, it is determined at 27 that the respective optimization aim is not yet achieved, it is checked at 29 whether for achieving the respective optimization aim any of the preceding optimization aims, i.e. optimization aims of higher priority, would have to be violated. If this is the case (YES at 29), the respective optimization aim may be discarded, and at 28 the next optimization aim may directly put forth. At first, however, it may be checked at 30 whether a modification of the respective optimization aim is possible which then (YES at 30) follows at 31 before repeating act 25 with regard to the modified optimization aim. If, however, it is determined at 29 that the fulfillment of the respective optimization aim would not violate an optimization aim of higher priority (NO at 29), the energy consumption and generation units in the grid section available for this purpose are controlled with regard to their connection power values both in respect of their active power components and their reactive power components to achieve the present optimization aim at 32. In this act, the topology of the grid section determined according to the method described above is considered at 33, particularly in form of the matrices according to FIGS. 2 and 3. Whether, by means of the control at 32, the respective optimization aim has been achieved, is then checked at 25. The control at 32 for achieving the respective optimization aim is, in one embodiment, executed as a modification of the control of the energy consumption and generation units with regard to their connection power values which is already active for achieving all previous optimization aims, i.e. optimization aims of higher priority, at least if a permanent control of the energy consumption and/or generation units is necessary for achieving these previous optimization aims, i.e. if no temporary control is sufficient.

Many variations and modifications may be made to the various embodiments of this disclosure without departing substantially from the spirit and principles of this disclosure. All such modifications and variations are intended to be included herein within the scope of the present disclosure, as defined by the following claims.

The invention claimed is:

1. A method of determining a topology of a grid section of an AC power grid, the grid section comprising a grid connection point, at least one branch branching off from the grid connection point and including a plurality of energy generation units, and at least one measurement point in the at least one branch, the method comprising:
    measuring a grid voltage at the at least one measurement point with a voltage measuring device;
    feeding at least one of an active power and a reactive power of at least two individual energy generation units of the plurality of energy generation units to the grid connection point via a branch of the at least one branch;
    determining, using a controller, dependencies of variations of the grid voltage at the at least one measurement point based on variations of connection power values of the at least two individual energy generation units of the plurality of energy generation units, the connection power values comprising measured connection power values of at least one of the at least two individual energy generation units, wherein the connection power values are measured at the at least two individual energy generation units of the plurality of energy generation units with a power value measuring device;
    forcing, using the controller, the variations of the connection power values of at least one of the at least some two individual energy generation units with a characteristic time course;
    assigning variations of the grid voltage to the individual energy generation units based on the characteristic time courses of their connection power values; and
    determining, using the controller, electric relative positions of the at least two individual energy generation units with regard to the at least one measurement point and the grid connection point from the determined dependencies.

2. The method of claim 1, wherein the electric relative positions of the at least two individual energy generation units are determined based on a correlation analysis of the variations of the grid voltage and the variations of the connection power values.

3. The method of claim 1, wherein, for determining the electric relative positions, it is determined whether the at least one measurement point and the at least two individual energy generation units are connected to at least one of a same phase and a same branch of the AC power grid.

4. The method of claim 3, wherein, for the at least one measurement point and those of the at least two individual energy generation units that are connected to the same branch, a sequence of connections to the same branch from the point of view of the grid connection point is determined.

5. The method of claim 1, wherein the variations of the connection power values are measured directly at all of the at least two individual energy generation units.

6. The method of claim 1, wherein the variations of the connection power values of at least one of the at least two individual generation units are derived from variations of the grid voltage.

7. The method of claim 6, further comprising, at first, recognizing unknown energy generation units based on variations of the grid voltage due to weather-dependent variations of their connection power values which are offset in time with regard to variations of the grid voltage due to weather-based variations of the measured connection power values of at least one known energy generation unit of the at least two individual energy generation units.

8. The method of claim 7, further comprising determining a spatial arrangement of recognized energy generation units including photovoltaic generators or wind generators based on variations of their connection power values time-wise offset with regard to known energy generation units including photovoltaic generators or wind generators.

9. The method of claim 6, wherein after determining the dependency of determined variations of the grid voltage on variations of the measured connection power values of at least one known energy generation unit of the at least two individual energy generation units, evaluating the measured grid voltage for the occurrence of variations which are similar to the determined variations but which are not dependent on variations of the directly measured connection power values of the at least one known energy generation unit, and that from the occurrence of similar variations a conclusion is drawn on the presence of energy generation units that are similar to the at least one known energy generation unit.

10. The method of claim 9, wherein a correlation analysis of the grid voltage with regard to the determined variations of the grid voltage is made to recognize similar variations of the grid voltage.

11. The method of claim 1, wherein the measured connection power values of the at least one of the at least two individual energy generation units are pure active or pure reactive power values.

* * * * *